Figure 1:
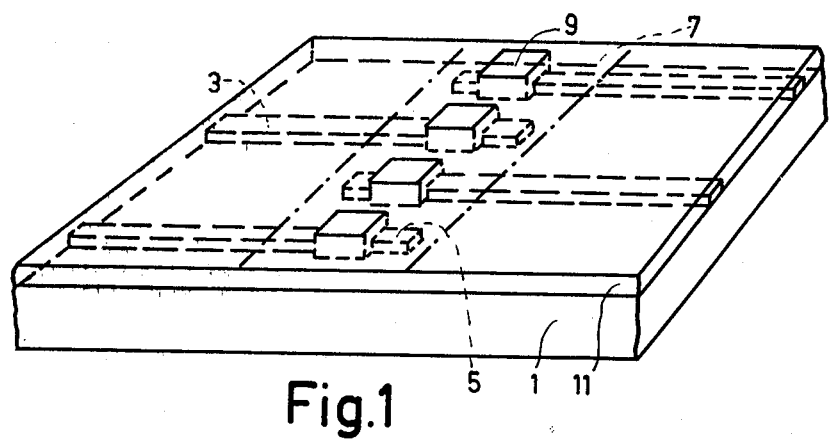

United States Patent
Gustin et al.

[11] 4,237,469
[45] Dec. 2, 1980

[54] ELECTROSTATIC WRITE HEAD

[75] Inventors: Pol A. G. J. Gustin; Raymond G. G. Shayes, both of Brussels, Belgium

[73] Assignee: U.S. Philips Corporation, New York, N.Y.

[21] Appl. No.: 962,264

[22] Filed: Nov. 20, 1978

[30] Foreign Application Priority Data

Dec. 6, 1977 [BE] Belgium ............................. 183186

[51] Int. Cl.³ ............................................ G01D 15/00
[52] U.S. Cl. .................................. 346/155; 340/139 C
[58] Field of Search ............ 346/155, 154, 165, 139 C

[56] References Cited

U.S. PATENT DOCUMENTS

| 3,618,118 | 11/1971 | Lloyd | 346/155 |
| 3,752,288 | 8/1973 | Detig | 346/155 |
| 3,984,844 | 10/1976 | Tanno | 346/139 C |
| 4,082,619 | 4/1978 | Dehnert | 346/165 |

OTHER PUBLICATIONS

IBM Technical Discl. Bulletin, vol. 15, No. 3, 8/72, Barrington et al., "Printed Circuit Wiring Head ...", p. 775.

Primary Examiner—John H. Wolff
Attorney, Agent, or Firm—Robert S. Smith

[57] ABSTRACT

An electrostatic write head includes of an insulating plate provided with conductor tracks which comprise end portions which are situated in a strip-shaped region which extends across the central portion of the plate, perpendicularly to the longitudinal direction of this region. The end portions comprise thickened parts which serve as write electrodes. Successive adjacent end portions are connected to conductor tracks which extend in opposite directions. An insulating layer covers the end portions, but leaves the thickened parts bare.

2 Claims, 3 Drawing Figures

U.S. Patent     Dec. 2, 1980     4,237,469

ELECTROSTATIC WRITE HEAD

The invention relates to an electrostatic write head, consisting of an insulating plate on a main surface of which there are provided conductor tracks, each of which comprises an end portion which is locally thickened in order to form a write electrode, said end portions being mutually parallel.

In a known write head of this kind (see German Patent Specification No. 2,150,715), the thickened portions are situated at the ends of the conductor tracks which are situated at an edge of the insulating plate, the distance between the end portions being equal to that between the conductor tracks.

The invention has for its object to provide a write head in which the distance between two adjacent conductor tracks is twice the distance between two adjacent end portions in order to minimize mutual influencing of the conductor tracks.

To this end, the write head in accordance with the invention is characterized in that the end portions are situated in a strip-shaped region which extends across the central portion of the plate and extend perpendicularly to the longitudinal direction of this region, every two conductor tracks having directly adjacent end portions entering the strip-shaped region from opposite directions, at least the end portions of the conductor tracks being covered by an insulating layer with the exception of the thickened parts.

The insulating layer at the area of the end portions prevents contact between the record carrier with which the write head cooperates and the parts of the end portions which are not thickened.

The invention will be described in detail hereinafter with reference to the accompanying diagrammatic drawing.

Figure 2:
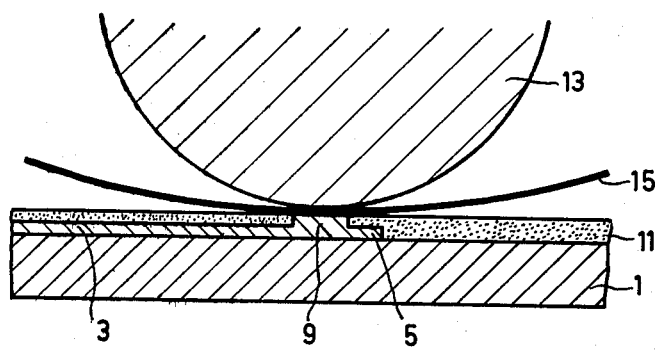
Figure 3:
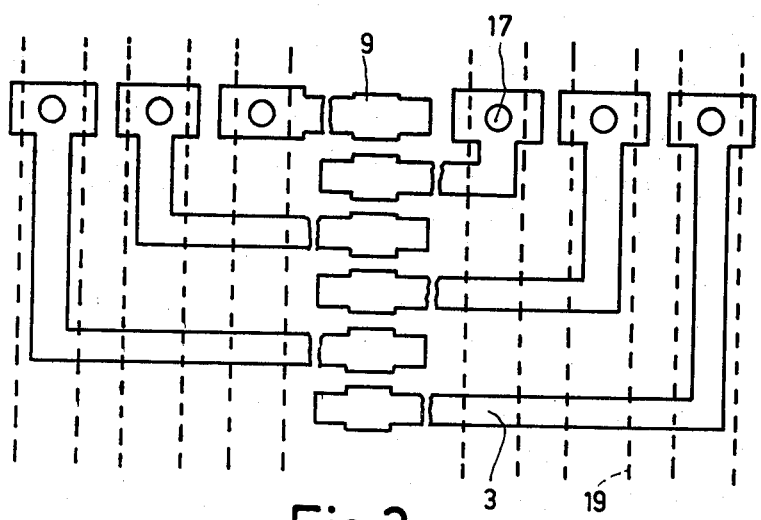

FIG. 1 is a perspective view of an embodiment of an electrostatic write head in accordance with the invention, FIG. 2 is a sectional view of the write head in the operating condition, and FIG. 3 shows a wiring diagram of the write head shown in FIG. 1.

As is shown in FIG. 1, the write head in accordance with the invention comprises an insulating plate 1 on a main surface of which conductor tracks 3 are provided (denoted by broken lines) by a technique which is commonly used for the manufacture of printed circuit boards. The conductor tracks 3 comprise mutually parallel end portions 5 which are situated in a strip-shaped region 7 which is denoted by dot/dash lines and which extends across the central portion of the plate 1. Each successive conductor track 3 in region 7 enters the strip-shaped region 7 from an opposite direction, so that the lateral distance between successive conductor tracks on one side of region 7 is twice the lateral distance between successive end portions. The end portions 5 extend perpendicularly to and away from the longitudinal direction of the region 7, and each end portion is locally provided with a thickened part 9 by the local deposition of metal on the end portions by means of an electrolytic process.

The conductor tracks 3, including the end portions 5, are covered by an insulating layer 11 which leaves the thickened parts 9 bare. These thickened parts form write electrodes which can constitute, in cooperation with a counter electrode 13 (see FIG. 2), the writing section of an electrostatic printer. When a suitable voltage difference is applied between one of the thickened parts 9, serving as a write electrode, and the counter electrode 13, a point-shaped charge image is formed on an insulating surface of a record carrier 15. The counter electrode 13 is preferably rounded, so that it presses the record carrier 15 against the write head only at the area of the thickened parts 9. The insulating layer 11 prevents any contact between the conductor tracks 3 and the record carrier. Obviously, the risk of such a contact exists notably at the area of the end portions 5 so that, if desired, it may be sufficient to use an insulating layer which only covers the end portions.

The connection between the conductor tracks 3 and a circuit for controlling the write head can be realized via connection points at the ends of the tracks which are situated at the edge of the plate 1 (not shown). However, it is alternatively possible (see FIG. 3) to connect each of the conductor tracks 3, via a plated-through hole 17 in the plate 1, to an interconnection conductor 19 (denoted by a broken line) on the other main surface of the plate. If desired, the control circuit may then be completely or partly accommodated on this second main surface.

What is claimed is:
1. An electrostatic write head which comprises:
an insulating plate having at least one major surface,
a plurality of conductor tracks disposed on said one major surface,
each track of said plurality of conductor tracks comprising a first end portion having at least first and second axial portions, said first axial portion having a cross-section which has a greater area than the area of any other cross-section at any other axial portion thereof, said first axial portion comprising a write electrode,
each first end portion of each track of said plurality of conductor tracks being coplanar with a part of the conductor track to which it is connected in said plurality of conductor tracks,
each conductor track in said plurality of conductor tracks being disposed in physically spaced relation from every other conductor track in said plurality of conductor tracks on said one major surface and having no magnetically or electrically conductive paths between any two conductor tracks in said plurality of conductor tracks on said one major surface, each of said end portions being mutually parallel,
said first end portions being disposed in an elongated strip-shaped region which extends along the central portion of said one major surface,
each of said first end portions extending perpendicularly to the longitudinal direction of said region,
each conductor track in said plurality of conductor tracks extending from said strip-shaped region in only a single direction,
each successive conductor track in said plurality of conductor tracks extending from said strip-shaped region in opposite directions, at least said first end portion of each conductor track in said plurality of conductor tracks being covered by an insulating layer with the exception of said first axial portion.

2. An electrostatic write head as claimed in claim 1 wherein said plate further includes a second major surface which is opposite to said one major surface, a plurality of plated-through holes and a plurality of interconnection conductors carried on said second major surface, each of said conductor tracks in said plurality of conductor tracks being connected via one of said plated-through holes to an interconnection conductor on said second major surface of said plate.

* * * * *